United States Patent
Kano

(10) Patent No.: US 10,178,811 B2
(45) Date of Patent: Jan. 8, 2019

(54) ROTATION CONTROL METHOD, INFORMATION PROCESSING DEVICE, AND NON-TRANSITORY COMPUTER-READABLE RECORDING MEDIUM STORING ROTATION CONTROL PROGRAM

(71) Applicant: FUJITSU LIMITED, Kawasaki-shi, Kanagawa (JP)

(72) Inventor: Masachika Kano, Machida (JP)

(73) Assignee: FUJITSU LIMITED, Kawasaki (JP)

( * ) Notice: Subject to any disclaimer, the term of this patent is extended or adjusted under 35 U.S.C. 154(b) by 121 days.

(21) Appl. No.: 15/253,932

(22) Filed: Sep. 1, 2016

(65) Prior Publication Data

US 2017/0099748 A1 Apr. 6, 2017

(30) Foreign Application Priority Data

Oct. 5, 2015 (JP) ................. 2015-197790

(51) Int. Cl.
*H05K 7/20* (2006.01)
*G06F 1/20* (2006.01)

(52) U.S. Cl.
CPC ......... *H05K 7/20836* (2013.01); *G06F 1/206* (2013.01); *H05K 7/20718* (2013.01); *H05K 7/20727* (2013.01)

(58) Field of Classification Search
CPC .......... H05K 7/20836; H05K 7/20718; H05K 7/20727; H05K 7/20736; G06F 1/206
See application file for complete search history.

(56) References Cited

U.S. PATENT DOCUMENTS

| 8,145,926 B2* | 3/2012 | Park ..................... G06F 1/203 |
| | | 713/320 |
| 9,436,241 B2* | 9/2016 | Tang ..................... G06F 1/20 |
| 9,578,787 B2* | 2/2017 | DeSouza ............ H05K 7/20836 |
| 2007/0046230 A1* | 3/2007 | Tsutsui .................... G06F 1/206 |
| | | 318/268 |
| 2009/0296342 A1* | 12/2009 | Matteson ................ G06F 1/206 |
| | | 361/679.46 |
| 2010/0228403 A1 | 9/2010 | Eto |
| 2011/0077796 A1* | 3/2011 | Aklilu ................ G05D 23/1917 |
| | | 700/300 |
| 2011/0176275 A1 | 7/2011 | Sato |
| 2011/0320061 A1* | 12/2011 | Chen .................... G05D 16/185 |
| | | 700/300 |

(Continued)

FOREIGN PATENT DOCUMENTS

| JP | 2010-211269 | 9/2010 |
| JP | 2011-151131 | 8/2011 |

*Primary Examiner* — Stephen W Smoot
(74) *Attorney, Agent, or Firm* — Fujitsu Patent Center

(57) ABSTRACT

A rotation control method, includes: calculating, by a processor in an information processing device, a first difference between a temperature of a component in the information processing device and an upper limit of a tolerable temperature for the component; calculating a second difference between a temperature of an environment in which the information processing device is installed and an upper limit of a tolerable temperature for the environment; and setting a rotation speed of a fan for cooling down the component, based on a comparison result between the first difference and the second difference.

20 Claims, 17 Drawing Sheets

(56) References Cited

U.S. PATENT DOCUMENTS

| | | | |
|---|---|---|---|
| 2013/0158713 A1* | 6/2013 | Geissler | G05D 23/1932 700/275 |
| 2013/0228325 A1* | 9/2013 | Suzuki | G06F 1/206 165/287 |
| 2014/0032011 A1* | 1/2014 | Artman | G05D 23/1932 700/300 |
| 2014/0092549 A1* | 4/2014 | Kodama | H05K 7/20745 361/679.48 |
| 2014/0150480 A1* | 6/2014 | Kodama | F24F 11/006 62/89 |
| 2015/0081132 A1* | 3/2015 | Shirokaze | G06F 1/206 700/300 |
| 2017/0017280 A1* | 1/2017 | Nakanishi | G06F 1/20 |

* cited by examiner

FIG. 11

| COMPONENT | TEMPERATURE SENSOR VALUE | LIMIT TEMPERATURE | TEMPERATURE ON WHICH ROTATION SPEED IS STARTED TO BE RAISED | TEMPERATURE ON WHICH ROTATION SPEED IS MAXIMIZED |
|---|---|---|---|---|
| CPU | T (CPU) | TL (CPU) | Tfs (CPU) | Tfe (CPU) |
| HDDx | T (HDDx) | TL (HDDx) | Tfs (HDDx) | Tfe (HDDx) |
| MEMORY | T (Mem) | TL (Mem) | Tfs (Mem) | Tfe (Mem) |
| PSU | T (PSU) | TL (PSU) | Tfs (PSU) | Tfe (PSU) |
| ENVIRONMENTAL TEMPERATURE | T (room) | TL (room) | Tfs (room) | Tfe (room) |

FIG. 12

| COMPONENT | POWER CONSUMPTION | THRESHOLD VALUE OF POWER CONSUMPTION |
|---|---|---|
| CPU | W (CPU) | Ws (CPU) |
| HDDx | W (HDDx) | Ws (HDDx) |
| MEMORY | W (Mem) | Ws (Mem) |
| PSU | W (PSU) | Ws (PSU) |

FIG. 13

|        | room    | HDD1h    | HDD2h    | HDD3h    | HDD4h    | CPU    | MEMORY  | PSU    | LOW    |
|--------|---------|----------|----------|----------|----------|--------|---------|--------|--------|
| FAN 1f | F(room) | F(HDD1h) |          |          |          | F(CPU) |         |        | F(low) |
| FAN 2f | F(room) |          | F(HDD2h) |          |          |        | F(Mem)  |        | F(low) |
| FAN 3f | F(room) |          |          | F(HDD3h) |          |        |         |        | F(low) |
| FAN 4f | F(room) |          |          |          | F(HDD4h) |        |         | F(PSU) | F(low) |

ROTATION CONTROL METHOD, INFORMATION PROCESSING DEVICE, AND NON-TRANSITORY COMPUTER-READABLE RECORDING MEDIUM STORING ROTATION CONTROL PROGRAM

CROSS-REFERENCE TO RELATED APPLICATION

This application is based upon and claims the benefit of priority of the prior Japanese Patent Application No. 2015-197790, filed on Oct. 5, 2015, the entire contents of which are incorporated herein by reference.

FIELD

The embodiment discussed herein is related to a cooling fan.

BACKGROUND

On a computer system, hardware components (referred to merely as components, below) such as a central processing unit (CPU), a memory, a hard disk drive (HDD), and a power supply unit (PSU) are mounted. When power is supplied and components operate, electric energy is converted into thermal energy and temperatures of the components rise. However, excessive temperature rise causes breakdown or the like of the components. Therefore, a cooling fan is installed in the computer system so as to cool down the components by air blown from the fan.

A related technique is disclosed in Japanese Laid-open Patent Publication No. 2010-211269 or Japanese Laid-open Patent Publication No. 2011-151131.

SUMMARY

According to an aspect of the invention, a rotation control method, includes: calculating, by a processor in an information processing device, a first difference between a temperature of a component in the information processing device and an upper limit of a tolerable temperature for the component; calculating a second difference between a temperature of an environment in which the information processing device is installed and an upper limit of a tolerable temperature for the environment; and setting a rotation speed of a fan for cooling down the component, based on a comparison result between the first difference and the second difference.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 11 illustrates an example of a temperature table;

FIG. 12 illustrates an example of a power table;

FIG. 13 illustrates an example of a rotation speed which is set for each fan;

DESCRIPTION OF EMBODIMENT

For example, as a rotational speed of a fan is increased, strength of blown air is increased. Therefore, a risk in which components are destroyed due to temperature rise is reduced. However, as the rotation speed is increased, consumed power is increased. For example, a large amount of power is consumed through an operation of a computer system in a data center, so that rotation of a fan may be controlled not only in the light of stable operation of the computer system but also in the light of suppression of power consumption.

Power consumption is suppressed by rotation control of a fan, for example. Rotation of a fan is controlled based on an intake air temperature of the fan and a temperature of a component which is cooled down by the cooling fan and thus, power consumption is reduced, for example.

In an office on non-working days, for example, such state may be generated that a room temperature is high because an air conditioner is turned off, while a load is low because a component is not operated. Thus, if rotation is controlled based on an intake air temperature (or a temperature of a room in which a computer system is installed) even in a state that a temperature of the component is low due to a low load, the component may be excessively cooled down and power may be wastefully consumed.

For example, as a load on a component is increased, a temperature of the component (referred to below as a component temperature) is increased by the size of the load. Therefore, in the case where the component temperature reaches a predetermined temperature, reach of a component temperature to a temperature, on which an error of the component occurs, may be suppressed by increasing a rotation speed of a fan to lower the temperature of the component. Hereinafter, a temperature on which an error of a component occurs (an upper limit of a tolerable temperature for a component) may be referred to as a limit temperature of a component.

In the case where a load of a component is maintained high (a load is 100%, for example), when a temperature of a room in which a computer system is installed (referred to below as an environment temperature) changes, the component temperature changes along with the change of the environment temperature. In this case as well, when the component temperature reaches a predetermined temperature, reach of the component temperature to a limit temperature may be suppressed by increasing a rotation speed of a fan to lower the component temperature.

Figure 1:
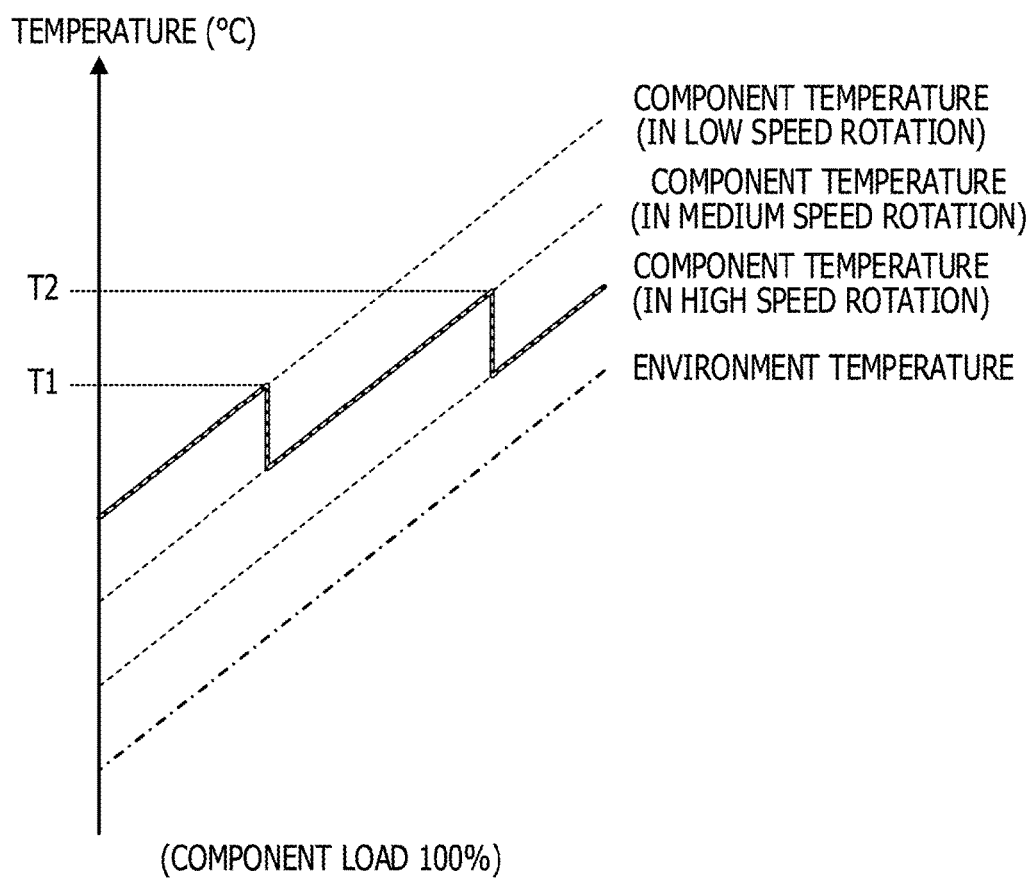
FIG. 1 illustrates an example of rotation control based on a component temperature.

FIG. 1 illustrates an example of rotation control based on a component temperature. FIG. 1 illustrates a component temperature in the case where a rotation speed is low, a component temperature in the case where a rotation speed is medium, a component temperature in the case where a rotation speed is high, and an environment temperature, in the case where a load of a component is 100%. An axis in the longitudinal direction represents a temperature.

In the case where a rotation speed is low, when the component temperature rises to a temperature T1, the rotation speed is switched from the low speed to the medium speed. On the other hand, in the case where a rotation speed is medium, when the component temperature falls to the temperature T1, the rotation speed is switched from the medium speed to the low speed. In the case a rotation speed is medium, when the component temperature rises to a temperature T2, the rotation speed is switched from the medium speed to the high speed. On the other hand, in the case a rotation speed is high, when the component temperature falls to the temperature T2, the rotation speed is switched from the high speed to the medium speed.

Figure 2:
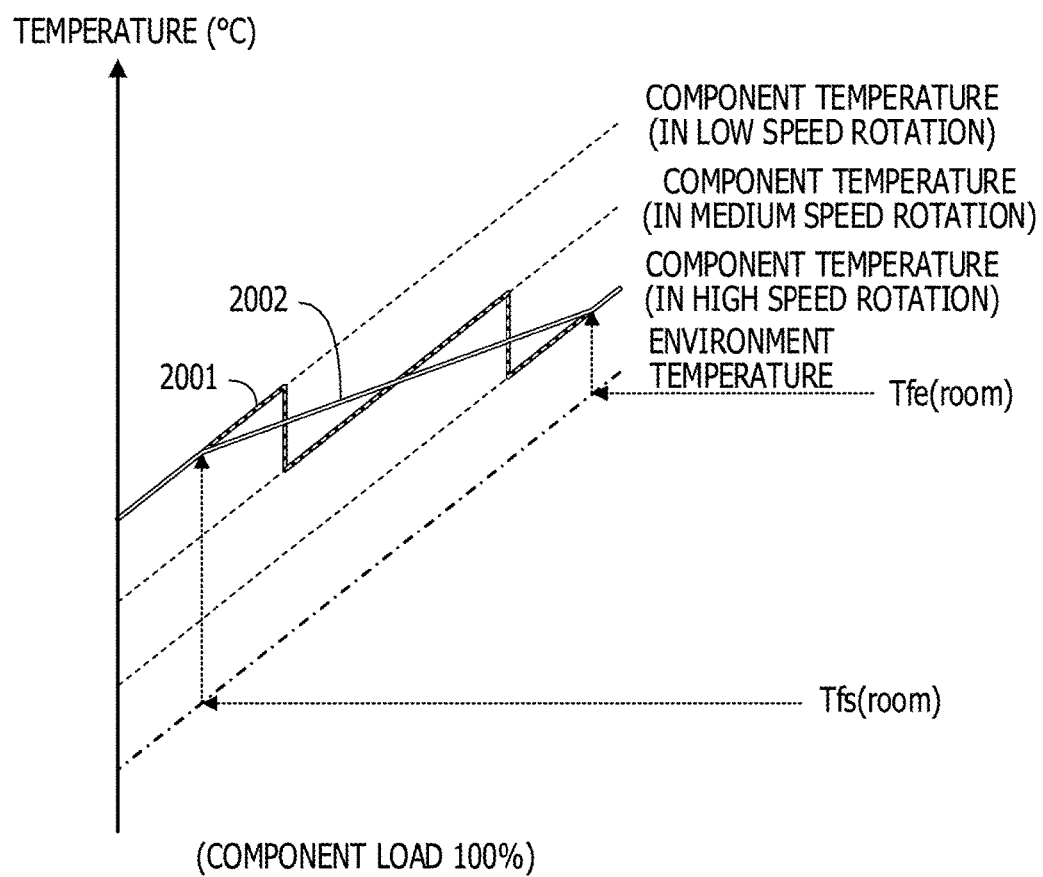
FIG. 2 illustrates an example of rotation control based on an environment temperature.

Rotation of a fan may be controlled based on an environment temperature. FIG. 2 illustrates an example of rotation control based on an environment temperature. FIG. 2 illustrates a component temperature in the case where a rotation speed is low, a component temperature in the case where a rotation speed is medium, a component temperature in the case where a rotation speed is high, and an environment temperature, in the case where a load of a component is 100%. An outlined dashed line 2001 represents the rotation control illustrated in FIG. 1 and an outlined solid line 2002 represents rotation control based on an environment temperature. An axis in the longitudinal direction represents a temperature. Tfs(room) represents an environment temperature on which the rotation speed of a fan is started to be raised and Tfe(room) represents an environment temperature on which the rotation speed of the fan reaches maximum.

As illustrated by the solid line 2002, in the case where a load of a component is 100%, the rotation speed is low when the environment temperature is lower than Tfs(room) and rotation control based on an environment temperature starts when the environment temperature reaches Tfs(room). In the case where the environment temperature is Tfs(room) or higher and Tfe(room) or lower, the rotation speed is set depending on the environment temperature. In the case where the environment temperature is higher than Tfe(room), the rotation speed is set to be high.

Figure 3:
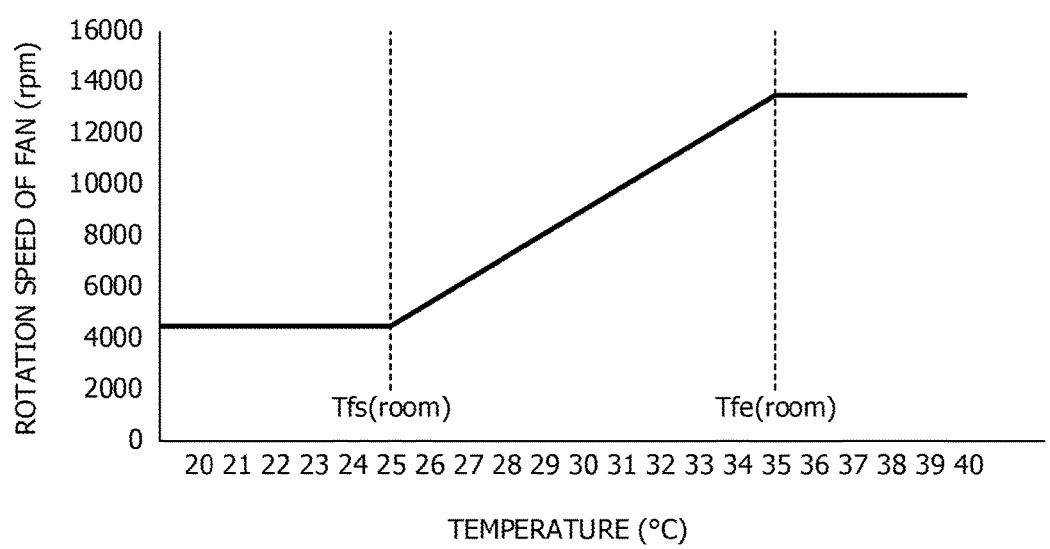
FIG. 3 illustrates an example of a relationship between a temperature and a rotation speed in the rotation control based on an environment temperature.

FIG. 3 illustrates an example of a relationship between a temperature and a rotation speed in rotation control based on an environment temperature. The control illustrated by the solid line 2002 may be performed in accordance with data expressing a graph illustrated in FIG. 3, for example. In FIG. 3, the horizontal axis represents a temperature and the vertical axis represents a rotation speed (revolution per minute (rpm)) of a fan. In the case where the environment temperature is Tfs(room) or lower, the rotation speed of a fan is set at approximately 4000 rpm. In the case where the environment temperature is Tfs(room) or higher and is Tfe(room) or lower, the rotation speed of a fan is increased as the environment temperature rises. In the case where the environment temperature is higher than Tfe(room), the rotation speed of a fan is set at approximately 14000 rpm.

Figure 4:
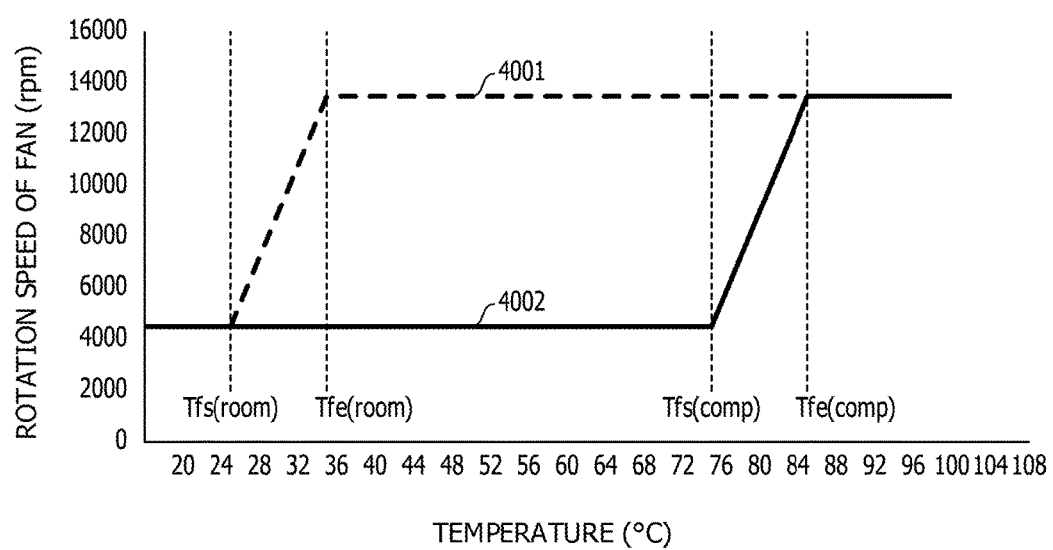
FIG. 4 illustrates an example of a relationship between the rotation control based on an environment temperature and the rotation control based on a component temperature.
Figure 5:
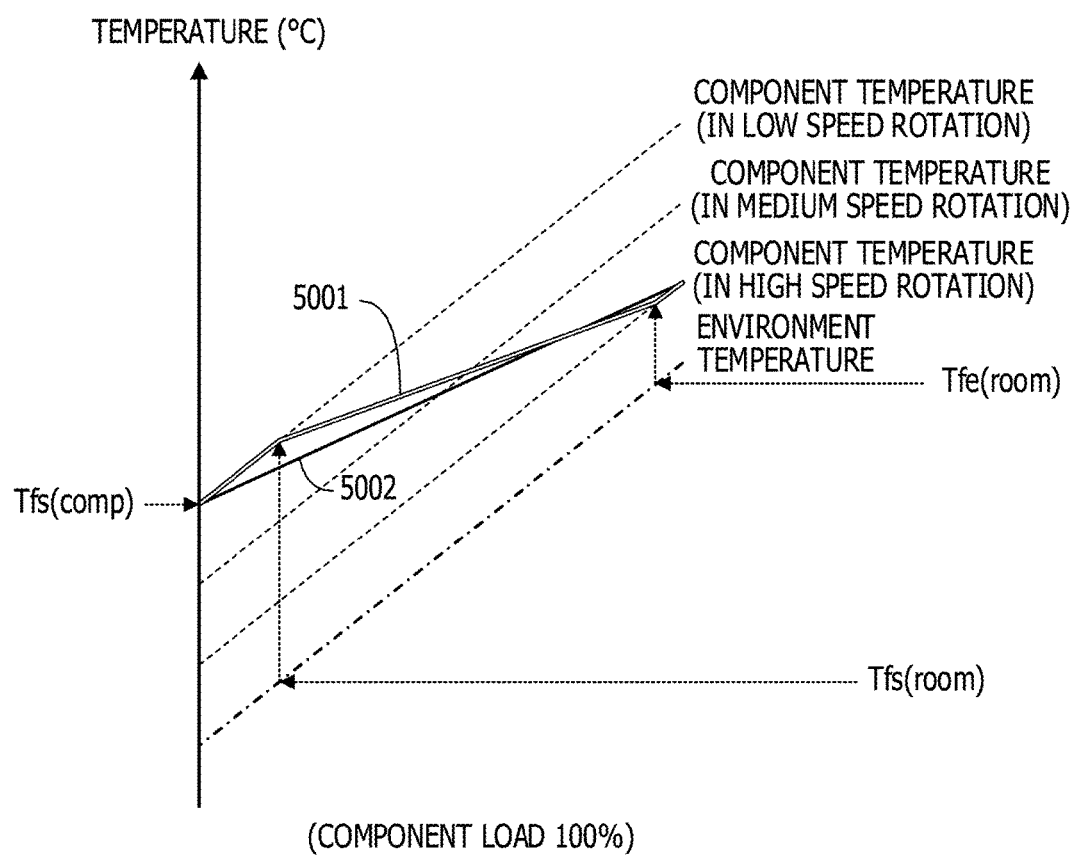
FIG. 5 illustrates an example of a relationship between the rotation control based on an environment temperature and the rotation control based on a component temperature.
Figure 6:
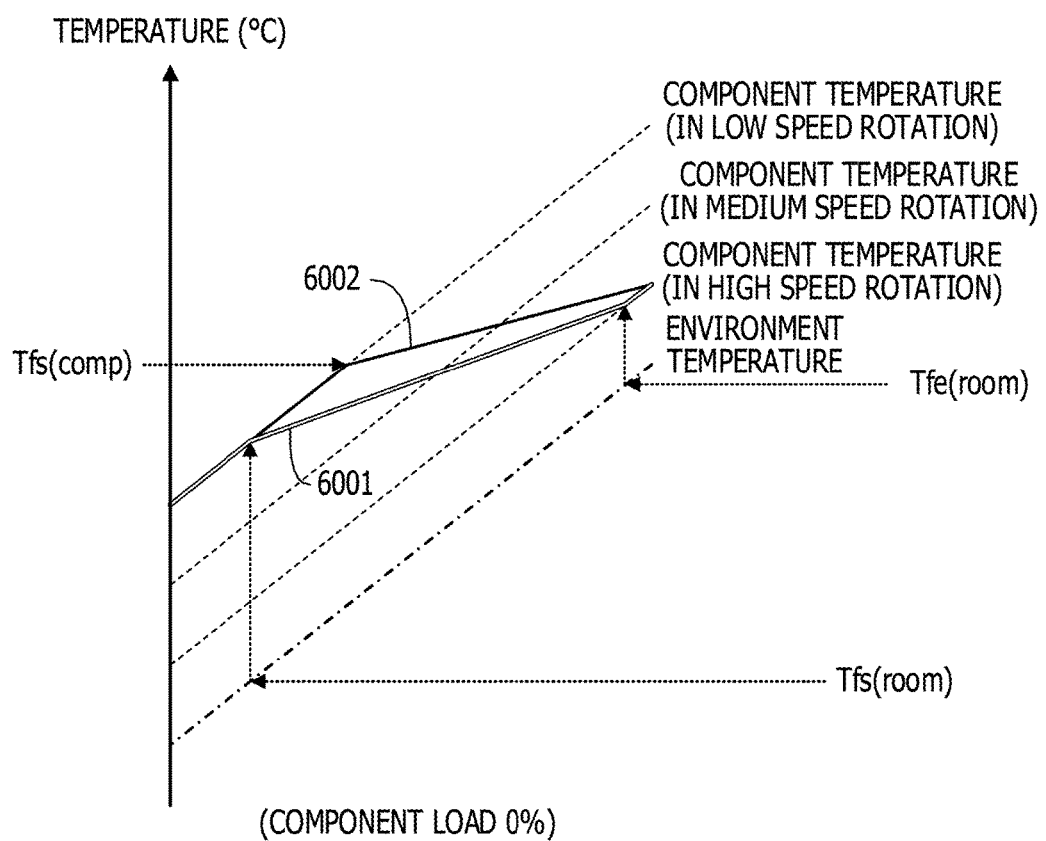
FIG. 6 illustrates an example of a relationship between the rotation control based on an environment temperature and the rotation control based on a component temperature.

FIGS. 4 to 6 illustrate an example of a relationship between rotation control based on an environment temperature and rotation control based on a component temperature. FIG. 4 illustrates a relationship between a rotation speed set based on an environment temperature and a rotation speed set based on a component temperature. In FIG. 4, the horizontal axis represents a temperature and the vertical axis represents a rotation speed. The rotation control based on an environment temperature is represented by a dashed line 4001 and the rotation control based on a component temperature is represented by a solid line 4002. Tfs(comp) represents a component temperature on which the rotation speed of a fan is started to be raised and Tfe(comp) represents a component temperature on which the rotation speed of the fan reaches maximum. In the case of execution of the rotation control based on an environment temperature, the rotation speed of the fan is started to be raised when the environment temperature reaches approximately 25 degrees Celsius and the rotation speed of a fan reaches maximum when the environment temperature reaches approximately 35 degrees Celsius. In the case of execution of the rotation control based on a component temperature, the rotation speed of a fan is started to be raised when the component temperature reaches approximately 75 degrees Celsius and the rotation speed of a fan reaches maximum when the component temperature reaches approximately 85 degrees Celsius.

FIG. 5 illustrates a relationship between the rotation control based on an environment temperature and the rotation control based on a component temperature in the case where a load of a component is 100%. FIG. 5 illustrates a component temperature in the case where a rotation speed is low, a component temperature in the case where a rotation speed is medium, a component temperature in the case where a rotation speed is high, and an environment temperature, in the case where a load of a component is 100%. An axis in the longitudinal direction represents a temperature. An outlined solid line 5001 represents the rotation control based on an environment temperature and a solid line 5002 represents the rotation control based on a component temperature.

It is conceivable that the component temperature rises when a load of the component is 100%. In the case of execution of the rotation control based on a component temperature, the rotation control based on a component temperature is started when the component temperature reaches Tfs(comp), as illustrated by the solid line 5002. In this case, the rise of the component temperature may be reduced by gradually changing the rotation speed of a fan from the low speed to the high speed. On the other hand, in the case of execution of the rotation control based on an environment temperature, even if the component temperature reaches Tfs(comp), the rotation speed may be maintained at low speed until the environment temperature reaches Tfs(room), as illustrated by the solid line 5001. When the environment temperature reaches Tfs(room), the rotation speed of a fan gradually rises from the low speed to the high speed. When the environment temperature is higher than Tfe(room), the state of the high speed rotation is maintained.

FIG. 6 illustrates a relationship between the rotation control based on an environment temperature and the rotation control based on a component temperature in the case where a load of the component is 0%. FIG. 6 illustrates a component temperature in the case where a rotation speed is low, a component temperature in the case where a rotation speed is medium, a component temperature in the case where a rotation speed is high, and an environment temperature, in the case where a load of a component is 0%. An axis in the longitudinal direction represents a temperature. An outlined solid line 6001 represents the rotation control based on an environment temperature and a solid line 6002 represents the rotation control based on a component temperature.

It is conceivable that the component temperature falls when a load of a component is 0%. In the case of execution of the rotation control based on an environment temperature, the rotation speed is low until the environment temperature reaches Tfs(room) as illustrated by the solid line 6001. When the environment temperature reaches Tfs(room), the rotation speed of a fan gradually rises from the low speed to the high speed. When the environment temperature is higher than Tfe(room), the state of the high speed rotation is maintained. On the other hand, in the case of execution of the rotation control based on a component temperature, even if the environment temperature reaches Tfs(room), the rotation speed is low until the component temperature reaches Tfs(comp). When the component temperature reaches Tfs(comp), the rotation control based on a component temperature is started. In this case, the rise of the component temperature may be reduced by gradually changing the rotation speed of a fan from the low speed to the high speed, as illustrated by the solid line 6002.

As illustrated in FIG. 6, in the case where a load on a component is 0%, when the rotation control is performed based on an environment temperature, the rotation speed of a fan rises even in a state in which the component temperature is not high, causing wasteful power consumption. This is because the environment temperature first reaches Tfs(room) because the component temperature is largely lower than Tfs(comp) in a low load state. Therefore, power consumption may be reduced in the case where a load on a component is low, as well.

Figure 7:
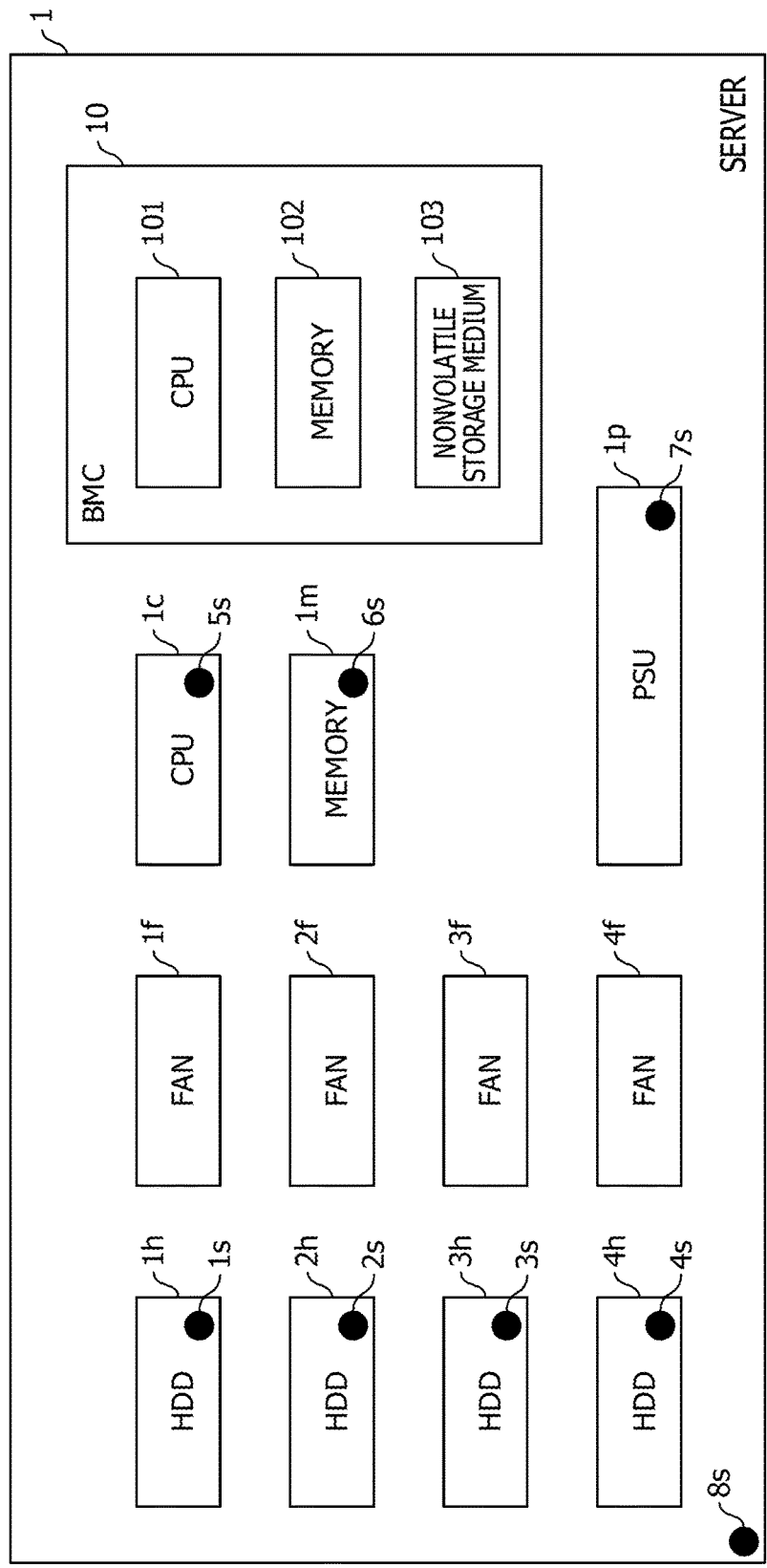
FIG. 7 illustrates an example of the hardware configuration of a server.

FIG. 7 illustrates an example of the hardware configuration of a server. For example, a server 1 which is a physical server includes HDDs 1h to 4h, cooling fans 1f to 4f, a CPU 1c, a memory 1m, a PSU 1p, a baseboarmanagement controller (BMC) 10 which executes monitoring, control, and the like of the hardware in the server 1, and temperature sensors 1s to 8s. The BMC 10, the components, and the fans are connected with each other by a bus, but the bus may be omitted so as to make the drawing easy to be viewed. FIG. 7 illustrates four HDDs, four fans, one CPU, one memory, and one PSU, but the numbers of these components are not limited.

The temperature sensors are attached to the HDDs 1h to 4h, the CPU 1c, the memory 1m, the PSU 1p, and a case of the server 1 so as to measure temperatures by these temperature sensors. For example, the temperature sensor 1s is attached to the HDD 1h, the temperature sensor 2s is attached to the HDD 2h, the temperature sensor 3s is attached to the HDD 3h, the temperature sensor 4s is attached to the HDD 4h, the temperature sensor 5s is attached to the CPU 1c, the temperature sensor 6s is attached to the memory 1m, the temperature sensor 7s is attached to the PSU 1p, and the temperature sensor 8s is attached to the case of the server 1. Information of measured temperatures is transmitted to the BMC 10 via the bus. The temperature sensor 8s may be a sensor for measuring an intake air temperature and a temperature measured by the temperature sensor 8s is used as an "environment temperature".

Figure 8:
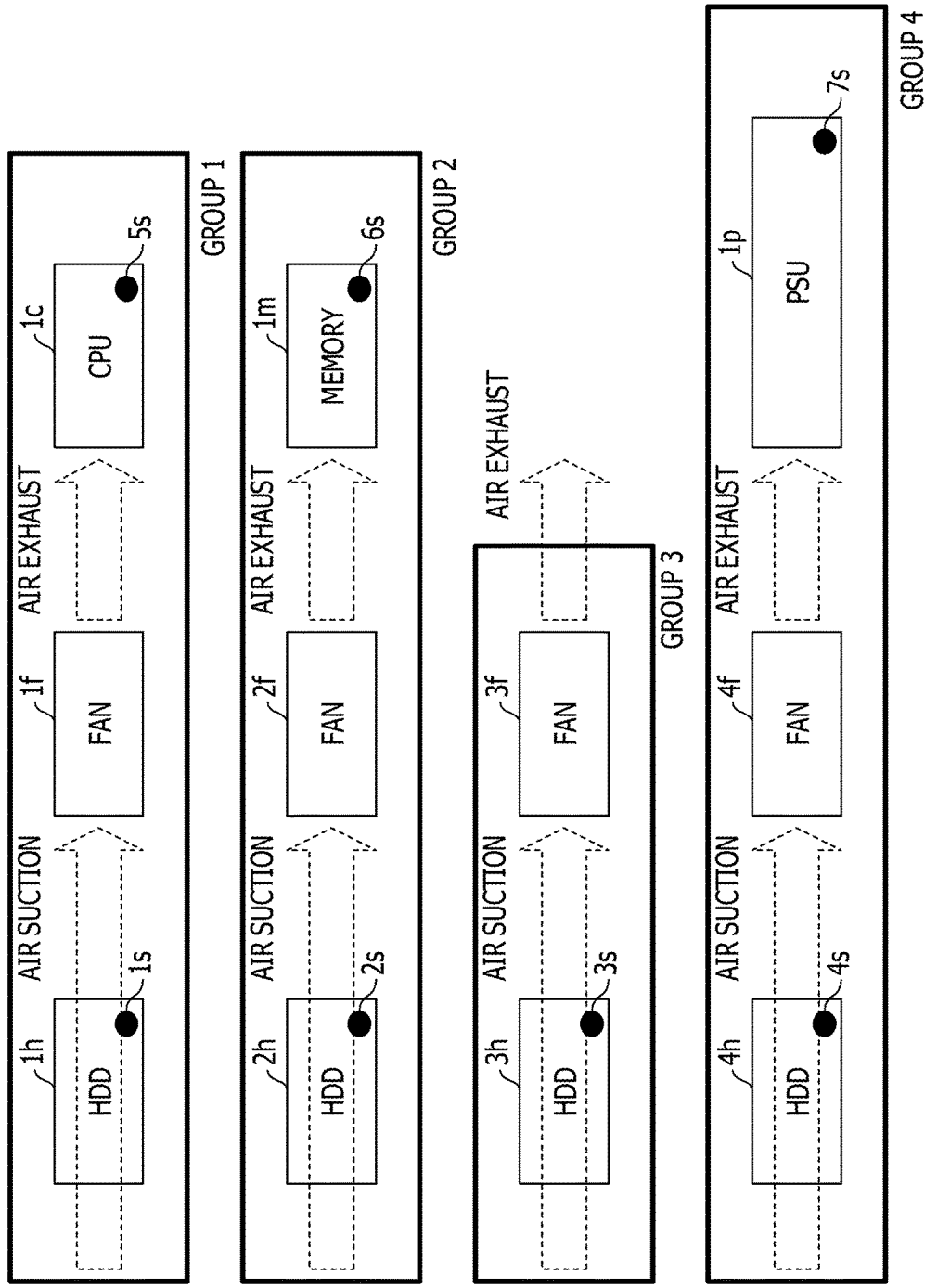
FIG. 8 illustrates an example of an aspect of cooling.

FIG. 8 illustrates an example of an aspect of cooling. For example, the components may be separated into four groups and the fan may cool down other components in each group. For example, in group 1, the fan 1f may cool down the HDD 1h by sucking air and may cool down the CPU 1c by exhausting air. In group 2, the fan 2f may cool down the HDD 2h by sucking air and may cool down the memory 1m by exhausting air. In group 3, the fan 3f may cool down the HDD 3h by sucking air. In group 4, the fan 4f may cool down the HDD 4h by sucking air and may cool down the PSU 1p by exhausting air.

Figure 9:
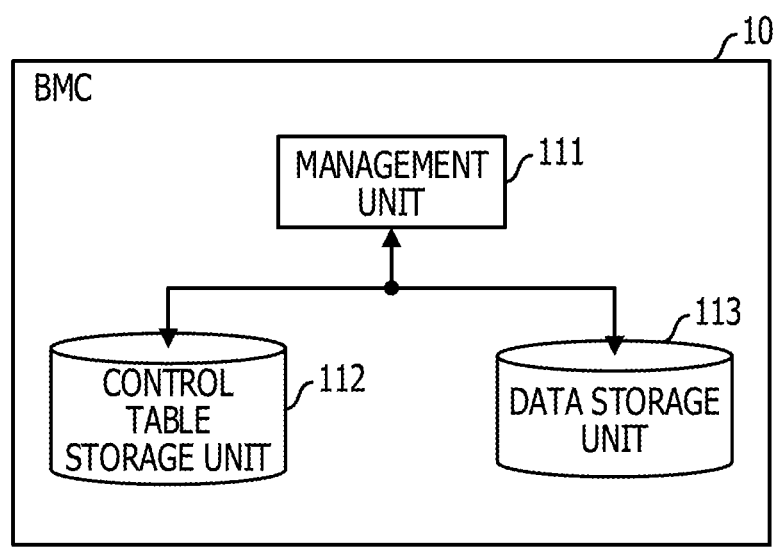
FIG. 9 illustrates an example of a functional block of a BMC.

In FIG. 7, the BMC 10 includes a CPU 101, a memory 102, and a nonvolatile storage medium 103. A program for executing processing (for example, firmware) is stored in the nonvolatile storage medium 103 and is loaded on the memory 102 by the CPU 101 to be executed. FIG. 9 illustrates an example of a functional block of the BMC. The BMC 10 includes a management unit 111 which is realized by a combination of a program and the CPU 101, and a control table storage unit 112 and a data storage unit 113 which are provided on the nonvolatile storage medium 103. The management unit 111 executes rotation control of the fans 1f to 4f based on data stored in the control table storage unit 112 and data stored in the data storage unit 113.

Figure 10:
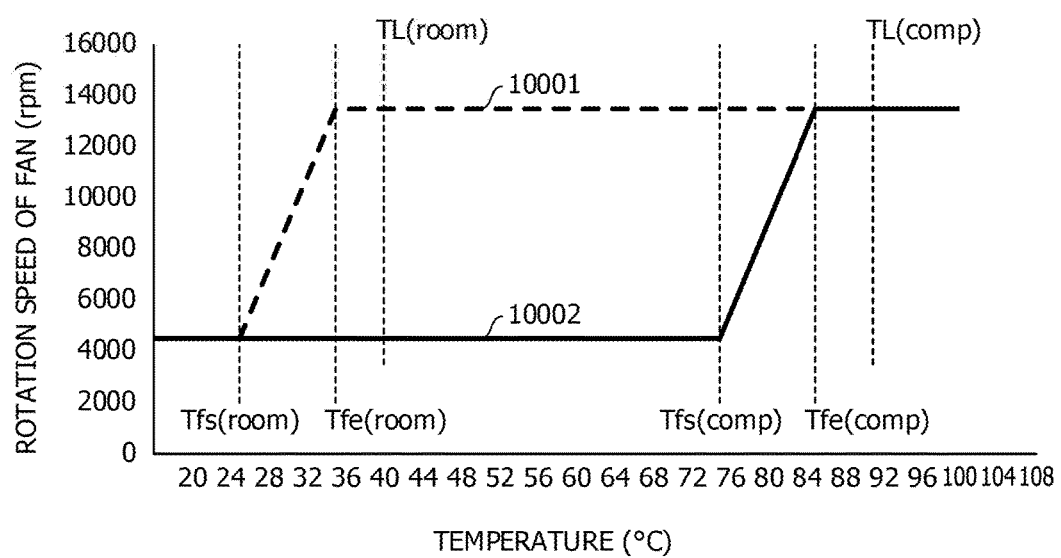
FIG. 10 illustrates an example of a relationship between a rotation speed and a temperature.

In the control table storage unit 112, data for controlling rotation of the fans 1f to 4f (this data is referred to below as control table) is stored. FIG. 10 illustrates an example of a relationship between a rotation speed and a temperature. A control table for a graph as that illustrated in FIG. 10 is stored. In FIG. 10, the horizontal axis represents a temperature and the vertical axis represents a rotation speed. The rotation control based on an environment temperature is represented by a dashed line 10001 and the rotation control based on a component temperature is represented by a solid line 10002. TL(room) represents a limit temperature of an environment and is an upper limit of a tolerable temperature for an environment. TL(comp) may be a limit temperature of a component and may be a temperature on which an error of a component occurs (that is, an upper limit of a tolerable temperature for a component). The solid line 10002 is prepared for each component. The control table may be stored in a storage region inside the fan.

FIG. 11 illustrates an example of a temperature table. FIG. 11 illustrates an example of a temperature table which is stored in the data storage unit 113. In FIG. 11, temperature sensor values, limit temperatures, temperatures on which a rotation speed of the fan is started to be raised, and temperatures on which the rotation speed is maximized are stored for respective components and an environment temperature. "HDDx" represents that information is stored for each of the HDDs 1h to 4h. The temperature sensor value is updated in real time by a value acquired from the temperature sensor. Values other than the temperature sensor values are fixed values which are preliminarily set by a manager or the like.

FIG. 12 illustrates an example of a power table. FIG. 12 illustrates an example of a power table which is stored in the data storage unit 113. In FIG. 12, power consumption and threshold values of power consumption are stored for respective components. Power consumption is calculated by the management unit 111 based on values measured by an ammeter and a voltmeter provided in the components, for example. Power consumption in the power table is updated in real time, but a threshold value of power consumption is a fixed value which is preliminarily set by a manager or the like. "HDDx" represents that information is stored for each of the HDDs 1*h* to 4*h*.

FIG. 13 illustrates an example of a rotation speed which is set for each fan. A rotation speed which is set for each fan is illustrated in FIG. 13. As illustrated in FIG. 13, a rotation speed of the fan 1*f* which belongs to the group 1 is set to be any of a rotation speed based on an environment temperature (denoted as F(room) below), a rotation speed based on a temperature of the HDD 1*h* (denoted like F(HDD1*h*) below), a rotation speed based on a temperature of the CPU 1*c*, and a low speed (denoted as F(low) below). A rotation speed of the fan 2*f* which belongs to the group 2 is set to be any of F(room), F(HDD2*h*), a rotation speed based on a temperature of the memory 1*m*, and F(low). A rotation speed of the fan 3*f* which belongs to the group 3 is set to be any of F(room), F(HDD3*h*), and F(low). A rotation speed of the fan 4*f* which belongs to the group 4 is set to be any of F(room), F(HDD4*h*), a rotation speed based on a temperature of the PSU 1*p*, and F(low).

Figure 14:
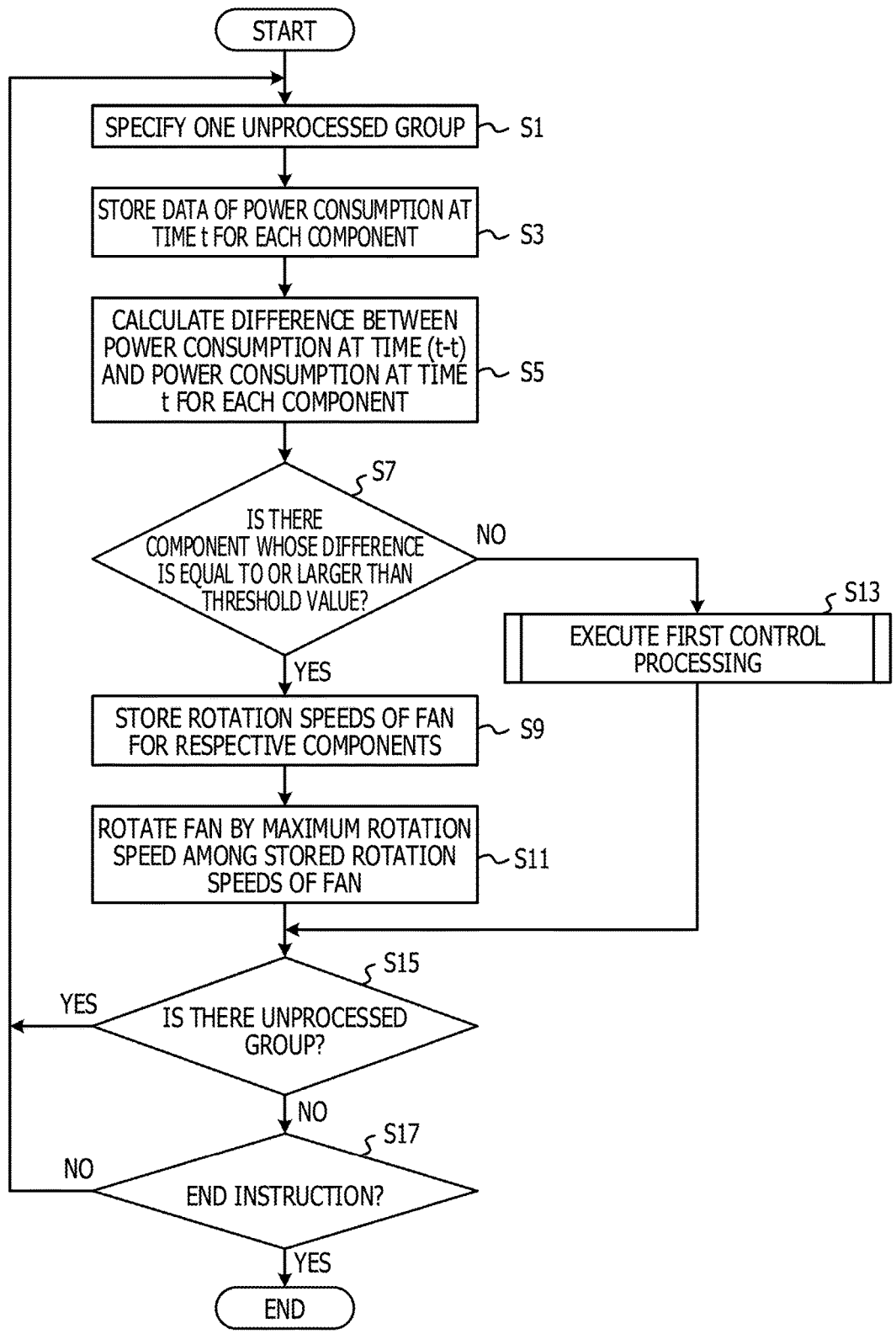
FIG. 14 illustrates an example of processing of a management unit of the BMC.
Figure 15:
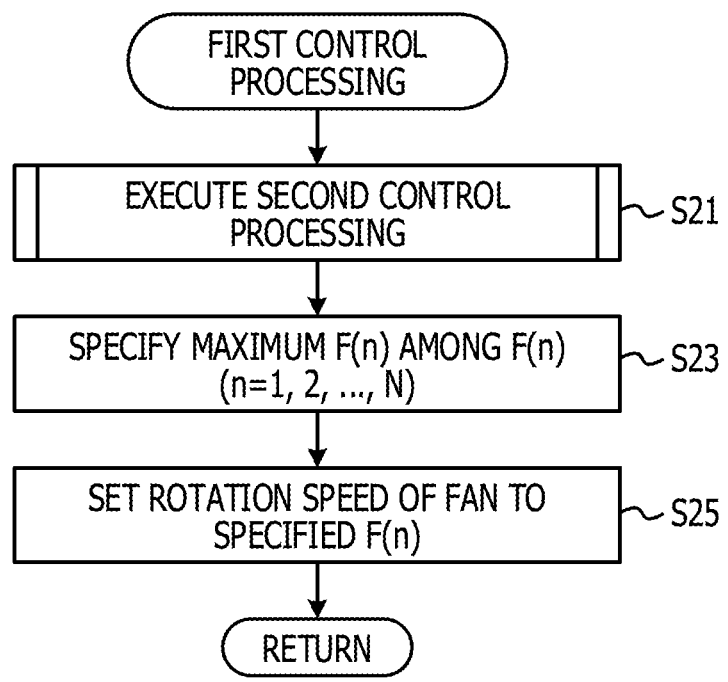
FIG. 15 illustrates an example of the processing of the management unit of the BMC.
Figure 16:
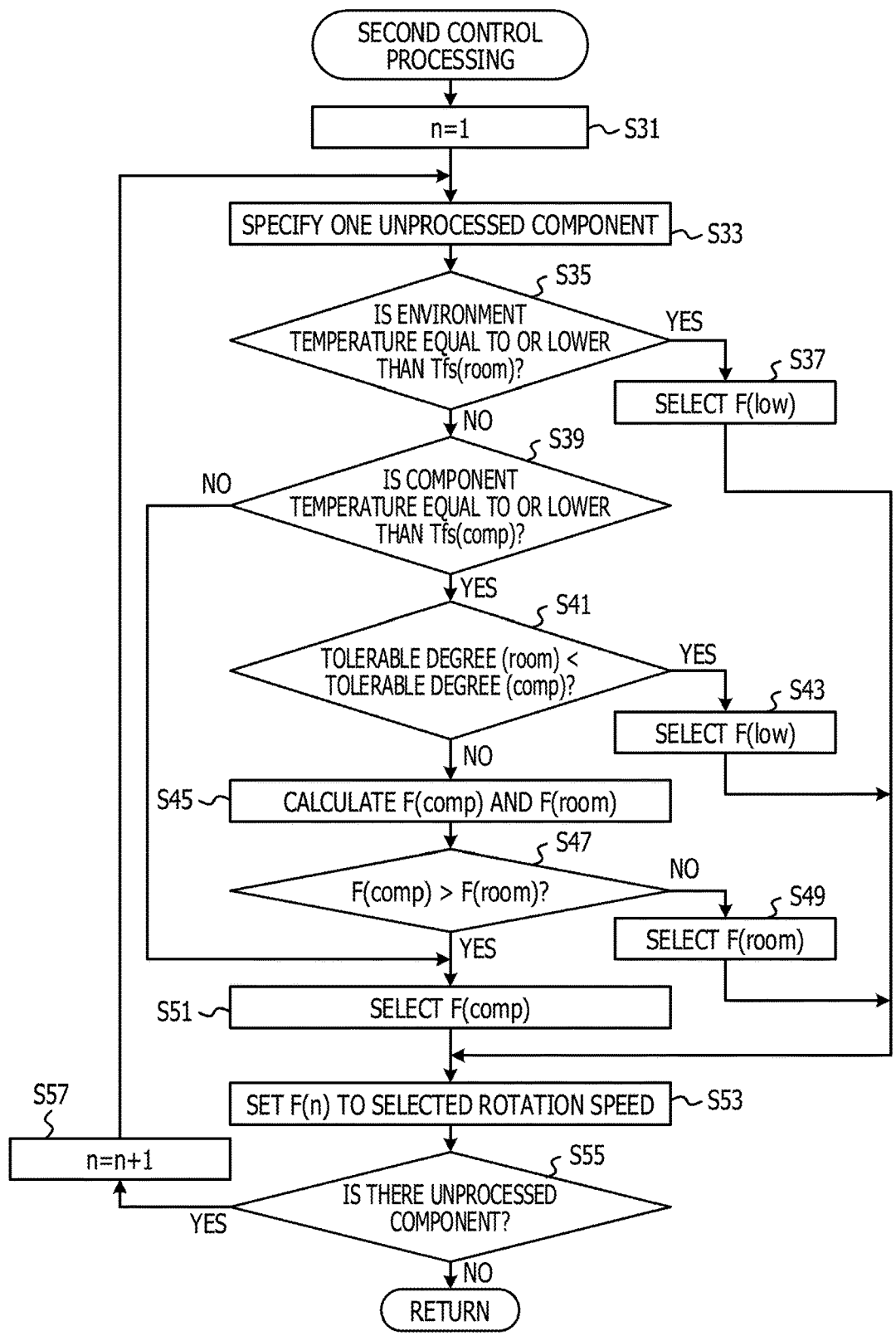
FIG. 16 illustrates an example of the processing of the management unit of the BMC.

FIGS. 14 to 16 illustrate an example of processing by a management unit of a BMC. The management unit 111 of the BMC 10 illustrated in FIG. 9 may execute the processing illustrated in FIGS. 14 to 16.

FIG. 14 illustrates a main flow of the processing. The management unit 111 of the BMC 10 specifies one unprocessed group from the groups 1 to 4 (FIG. 14: operation S1).

The management unit 111 preliminarily reads out data of power consumption at time (t−Δt) for each component belonging to the group specified in operation S1. Time (t−Δt) may be time on which operation S3 is executed last time. The management unit 111 calculates power consumption at time t for each component belonging to the group specified in operation S1 and stores data of the calculated power consumption in a column of power consumption of the power table (operation S3).

The management unit 111 calculates a difference between the power consumption at time (t−Δt) and the power consumption at time t for each component belonging to the group specified in operation S1 (operation S5).

The management unit 111 determines whether or not there is a component whose difference calculated in operation S5 is equal to or larger than a threshold value stored in the power table (operation S7). When there is a component whose difference is equal to or larger than the threshold value stored in the power table (operation S7: Yes route), the management unit 111 determines rotation speeds of fans for respective components based on current component temperatures and the control table so as to store the determined rotation speeds in the memory 102 (operation S9).

The management unit 111 rotates the fan belonging to the group specified in operation S1 by the maximum rotation speed among the rotation speeds of the fans stored in operation S9 (operation S11). For example, the management unit 111 sets a rotation speed with respect to a fan and the fan rotates in accordance with the rotation speed. It may be guaranteed that the temperature of any component does not reach the limit temperature by rotating the fan at the maximum rotation speed.

When there is no component whose difference calculated in operation S5 is equal to or larger than the threshold value stored in the power table (operation S7: No route), it may be considered that power consumption of each component is stable and a load is low. Therefore, the management unit 111 executes first control processing (operation S13). FIG. 15 illustrates the first control processing and FIG. 16 illustrates second control processing.

The management unit 111 executes the second control processing (FIG. 15: operation S21).

The management unit 111 sets a variable n representing the number of components as n=1 (FIG. 16: operation S31).

The management unit 111 specifies one unprocessed component among the components belonging to the group specified in operation S1 (operation S33).

The management unit 111 determines whether or not a sensor value of an environment temperature stored in the temperature table (for example, the latest environment temperature) is equal to or lower than Tfs(room) (operation S35). When the environment temperature is equal to or lower than Tfs(room) (operation S35: Yes route), the management unit 111 selects F(low) as a rotation speed (operation S37) and shifts the processing to processing of operation S53. As described above, F(low) is a rotation speed for low speed rotation and may be preliminarily set by a manager or the like.

When the environment temperature is not equal to or lower than Tfs(room) (operation S35: No route), the management unit 111 determines whether or not a sensor value of a component temperature stored in the temperature table (for example, the latest component temperature) is equal to or lower than Tfs(comp) (operation S39). For example, a sensor value for the component specified in operation S33 and Tfs for the component are compared with each other. For example, in the case where the component is the CPU 1*c*, a sensor value of the component temperature may be T(CPU) and Tfs may be Tfs(CPU). The same goes for other components.

In the case where the component temperature is not equal to or lower than Tfs(comp) (operation S39: No route), the processing shifts to processing of operation S45. In the case where the component temperature is equal to or lower than Tfs(comp) (operation S39: Yes route), the management unit 111 calculates a tolerable degree (room) and a tolerable degree (comp) so as to store the tolerable degree (room) and the tolerable degree (comp) in the memory 102. The management unit 111 determines whether or not the tolerable degree (room)<the tolerable degree (comp) is satisfied (operation S41). The tolerable degree (room) is a difference between an environment temperature and a limit temperature of an environment and the tolerable degree (comp) is a difference between a component temperature and a limit temperature of a component. In the case where the tolerable degree (comp) is larger than the tolerable degree (room), such state is conceivable that a load of the component is low and the environment temperature is relatively high. In such state, even if cooling is suppressed, a component may not be seriously influenced immediately. Change of a component temperature depends on change of an environment temperature in the case where a load of a component is low. However, even if the environment temperature rises by the tolerable degree (room), the component does not reach the limit temperature because of the tolerable degree (comp)−the tolerable degree (room). Therefore, in the case where the tolerable degree (comp) is larger than the tolerable degree (room), F(low) may be selected so as to reduce wasteful power consumption caused by excessive cooling.

In the case where the tolerable degree (room)<the tolerable degree (comp) is satisfied (operation S41: Yes route), the management unit 111 selects F(low) as the rotation speed (operation S43) and the processing shifts to the processing of operation S53.

On the other hand, in the case where the tolerable degree (room) <the tolerable degree (comp) is not satisfied (operation S41: No route), the management unit 111 calculates a rotation speed F(comp) based on a component temperature and a rotation speed F(room) based on an environment temperature in accordance with the control table stored in the control table storage unit 112 (operation S45).

The management unit 111 determines whether or not F(comp) >F(room) is satisfied (operation S47). In the case where F(comp) >F(room) is not satisfied (operation S47: No route), the management unit 111 selects F(room) as the rotation speed (operation S49) and the processing shifts to the processing of operation S53. On the other hand, in the case where F(comp) >F(room) is satisfied (operation S47: Yes route), the management unit 111 selects F(comp) as the rotation speed (operation S51).

The management unit 111 sets the rotation speed F(n) to the rotation speed selected in operation S37, S43, S49, or S51 (operation S53).

The management unit 111 determines whether or not there is an unprocessed component (operation S55). In the case where there is an unprocessed component (operation S55: Yes route), the management unit 111 increments n by 1 (operation S57) and the processing returns to the processing of operation S33. On the other hand, in the case where there is no unprocessed component (operation S55: No route), the processing returns to the processing of a caller.

In FIG. 15, the management unit 111 specifies the maximum F(n) among F(n) (n=1, 2, . . . , N; N denotes the number of components belonging to a group) which are calculated in the second control processing (operation S23). If the maximum F(n) is specified, it may be guaranteed that any component does not reach the limit temperature.

The management unit 111 sets the rotation speed of the fan belonging to the group which is specified in operation S1 as F(n) which is specified in operation S23 (operation S25). The processing returns to the processing of a read source.

In FIG. 14, the management unit 111 determines whether or not there is an unprocessed group (operation S15). In the case where there is an unprocessed group (operation S15: Yes route), the processing returns to operation S1 so as to execute processing for the next group.

On the other hand, in the case where there is no unprocessed group (operation S15: No route), the management unit 111 determines whether or not an end instruction is received from a manager of the server 1 (operation S17). In the case where an end instruction is not received (operation S17: No route), the processing returns to operation S1. On the other hand, in the case where an end instruction is received (operation S17: Yes route), the processing is ended.

Figure 17:
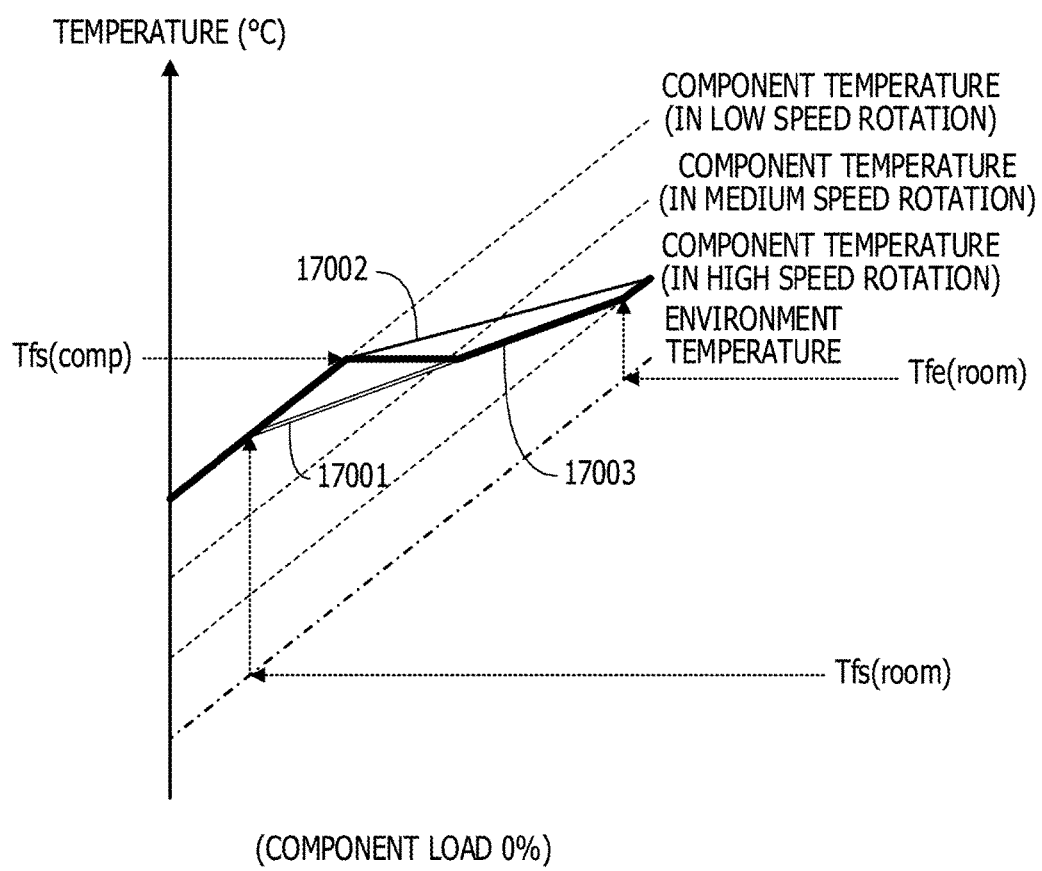
FIG. 17 illustrates an example of rotation control.

FIG. 17 illustrates an example of rotation control. FIG. 17 illustrates a component temperature in the case where a rotation speed is low, a component temperature in the case where a rotation speed is medium, a component temperature in the case where a rotation speed is high, and an environment temperature, in the case where a load of a component is 0%. An axis in the longitudinal direction represents a temperature. An outlined solid line 17001 represents the rotation control based on an environment temperature, a solid line 17002 represents the rotation control based on a component temperature, and a thick solid line 17003 represents the rotation control illustrated in FIGS. 14 to 16.

In the case where the environment temperature is equal to or lower than Tfs(room), the rotation speed is set to be low. Even in the case where the environment temperature is not equal to or lower than Tfs(room), the rotation speed is set to be low when the component temperature is equal to or lower than Tfs(comp) and the tolerance degree (comp) is larger than the tolerance degree (room). Therefore, execution of the rotation control based on an environment temperature may be reduced and wasteful power consumption caused by excessive cooling may be reduced in a state in which a load on the component is low and the component temperature is relatively low.

In the case where an air conditioner is turned off, therefore an environment temperature is high, and power consumption of a component is stable (it may be considered that a load on the component is low, for example) like in an office on non-working days, for example, the rotation speed is set to be low and therefore power consumption may be suppressed.

Further, in the data center, for example, such situation is generated that a load is concentrated on specific time or specific days of the week but a load is low on other time and other days of the week while an environment temperature is stable. In such case, the rotation speed of a fan may be set to be high beyond necessity based on an environment temperature. However, according to the above-mentioned processing, the rotation speed of the fan may be set to be low and accordingly, power consumption may be reduced.

The disclosed contents are not limited to the above description. For example, there is the case where the functional block configuration of the BMC 10 is not accorded with the actual program module configuration.

The configuration of each of the above-described tables may be an example. In the above-described processing flow, orders of processing may be changed and processing may be executed in parallel as long as the processing result does not change.

A low load of a component may be determined based on power consumption. For example, a load of a component such as a CPU use rate may be directly measured so as to determine the quantity of load. The above-mentioned form of a group, setting value of a temperature, setting value of a rotation speed of a fan, and the like may be examples.

For example, in a rotation control method, (A) a first difference which is a difference between a temperature of a component in an information processing device and an upper limit of a tolerable temperature for the component may be calculated, (B) a second difference which is a difference between a temperature of an environment in which the information processing device is installed and an upper limit of a tolerable temperature for the environment may be calculated, and (C) a rotation speed of a fan for cooling down the component may be set based on a comparison result between the first difference and the second difference.

When a difference between a temperature of a component and an upper limit of the temperature of the component is large even if a difference between a temperature of an environment and an upper limit of the temperature of the environment is small, the component is not seriously influenced, so that there is the case where a fan does not have to be rotated in high speed. On the other hand, when a difference between a temperature of a component and an upper limit of the temperature of the component is small even if a difference between a temperature of an environment and an upper limit of the temperature of the environment is large, the component is sometimes seriously influenced, so that there is the case where a fan is better to be rotate at high speed. Accordingly, if the above-mentioned processing is executed, a rotation speed of a fan may be appropriately set and accordingly, power consumed by the fan may be reduced.

In the processing for setting a rotation speed of a fan, (c1) in the case where the first difference is larger than the second difference, the rotation speed of the fan may be set to be a first rotation speed which is a rotation speed for suppressing power consumption and in the case where the first difference is equal to or smaller than the second difference, the rotation speed of the fan may be set to be a rotation speed which is a higher rotation speed between a rotation speed determined based on a temperature of the component and a rotation speed determined based on a temperature of the environment. Accordingly, an occurrence of breakdown of a component caused by temperature rise may be reduced and a rotation speed may be set to be a rotation speed by which wasteful power consumption may be suppressed.

In the rotation control method, (D) whether a temperature of the environment is higher than a first predetermined temperature and a temperature of the component is equal to or lower than a second predetermined temperature may be determined, (E) in the case where a temperature of the environment is higher than the first predetermined temperature and a temperature of the component is equal to or lower than the second predetermined temperature, the processing for calculating a first difference, the processing for calculating a second difference, and the processing for setting a rotation speed of the fan may be executed, (F) in the case where a temperature of the environment is lower than the first predetermined temperature, the rotation speed of the fan may be set to be the first rotation speed, and (G) in the case where a temperature of the component is higher than the second predetermined temperature, the rotation speed of the fan may be set to be a rotation speed which is a higher rotation speed between the rotation speed determined based on a temperature of the component and the rotation speed determined based on a temperature of the environment. Accordingly, a rotation speed of a fan may be more appropriately set by using not only the difference but also temperatures themselves.

In the rotation control method, (H) whether power consumption of the component is stable may be determined, and (I) in the case where the power consumption of the component is stable, the processing for determining whether a temperature of the environment is higher than the first predetermined temperature and a temperature of the component is equal to or lower than the second predetermined temperature may be executed. In the case where power consumption of a component is stable, it is conceivable that a load of the component is relatively low. Accordingly, the processing may be executed in the case where it is conceivable that a load of the component is relatively low.

The number of components may be plural. (a1) In the processing for calculating a first difference, the first difference may be calculated for each of a plurality of components and (c2) in the processing for setting a rotation speed of a fan, for each of a plurality of components, the processing for determining a rotation speed of a fan may be executed based on a comparison result between the first difference and the second difference and the rotation speed of the fan may be set to be the maximum rotation speed among a plurality of rotation speeds which are determined. Accordingly, the number of rotations of a fan may be set so that breakdown does not occur in any of a plurality of components.

A program for making a processor execute the above-mentioned processing may be produced. The program may be stored in a computer-readable recording medium or a storage device such as a flexible disk, a CD-ROM, a magneto-optical disk, a semiconductor memory, and a hard disk. An intermediate processing result may be temporarily stored in a storage device such as a main memory.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A rotation control method, comprising:
    calculating, by a processor in a system including a plurality of hardware components each having a temperature sensor, a first difference between a temperature of each of one or more hardware components included in each of groups obtained by dividing the plurality of hardware components in such a manner that each of the groups includes a fan to cool down the one or more hardware components and an upper limit of a tolerable temperature for the respective one or more hardware components;
    calculating a second difference between a temperature of an environment in which the system is installed and an upper limit of a tolerable temperature for the environment, the temperature of the environment being measured by a temperature sensor provided in the system and different from the temperature sensors in the plurality of hardware components;
    comparing the first difference and the second difference to obtain a comparison result indicating a load state of the respective one or more hardware components with respect to the temperature of the environment;
    acquiring one or more rotation speeds for the one or more hardware components of the fan to cool down the one or more hardware components, respectively, based on the comparison result between the first difference and the second difference in such a manner that, in a case where the first difference is greater than the second difference, the respective one or more rotation speeds of the fan are set to be a first rotation speed which is a rotation speed to reduce wasteful power consumption; and
    setting a final rotation speed of the fan to cool down the one or more hardware components based on the one or more rotation speeds.

2. The rotation control method according to claim 1, wherein in a case where the first difference is equal to or less than the second difference, the respective one or more rotation speeds of the fan are set to be a second rotation speed which is higher between a rotation speed based on a temperature of the respective one or more hardware components and a rotation speed based on a temperature of the environment.

3. The rotation control method according to claim 1, comprising:
    determining whether the temperature of the environment is higher than a first temperature and the temperature of the one or more respective hardware components are equal to or lower than respective second temperatures; and
    in a case where the temperature of the environment is higher than the first temperature and the temperature of the one or more respective hardware components is equal to or lower than the second temperature, executing the calculation of the first difference, the calculation of the second difference, and the acquisition of the one or more rotation speeds of the fan.

4. The rotation control method according to claim 3, comprising:
determining whether power consumption of the respective one or more hardware components is stable; and
in a case where the power consumption of the respective one or more hardware components is stable, determining whether the temperature of the environment is higher than the first temperature and the temperature of the respective one or more hardware components is equal to or lower than the second temperature.

5. The rotation control method according to claim 1, comprising:
determining whether or not the temperature of the environment is higher than a first temperature; and
acquiring, as the respective one or more rotation speeds of the fan, the first rotation speed in a case where the temperature of the environment is lower than the first temperature.

6. The rotation control method according to claim 1, comprising:
determining whether the temperature of the environment is higher than a first temperature and the temperature of the respective one or more hardware components is equal to or lower than a second temperature; and
in a case where the temperature of the environment is higher than the first temperature and the temperature of the respective one or more hardware components is higher than the second temperature, accruing, as the respective one or more rotation speeds of the fan, a second rotation speed which is higher between a rotation speed based on the temperature of the respective one or more hardware components and a rotation speed based on the temperature of the environment.

7. The rotation control method according to claim 1, wherein the one or more hardware components are provided along an air suction line or an air exhaust line of the fan which are included in each of the groups.

8. An information processing device, comprising:
a processor provided in the information device in a system including a plurality of hardware components each having a temperature sensor and configured to execute a program; and
a memory configured to store the program,
the processor, based on the program, performs operations of:
acquiring one or more hardware components included in each of groups obtained by dividing the plurality of hardware components in such a manner that each of the groups includes a fan to cool down the one or more hardware components;
calculating a first difference between a temperature of each of the one or more hardware components and an upper limit of a tolerable temperature for the respective one or more hardware components;
calculating a second difference between a temperature of an environment in which the system is installed and an upper limit of a tolerable temperature for the environment, the temperature of the environment being measured by a temperature sensor provided in the system and different from the temperature sensors in the plurality of hardware components;
comparing the first difference and the second difference to obtain a comparison result indicating a load state of the respective one or more hardware components with respect to the temperature of the environment;
acquiring one or more rotation speeds for the one or more hardware components of the fan to cool down the one or more hardware components, respectively, based on the comparison result between the first difference and the second difference in such a manner that, in a case where the first difference is greater than the second difference, the respective one or more rotation speeds of the fan are set to be a first rotation speed which is a rotation speed to reduce wasteful power consumption; and
setting a final rotation speed of the fan to cool down the one or more hardware components based on the one or more rotation speeds.

9. The information processing device according to claim 8, wherein the processor, in a case where the first difference is equal to or less than the second difference, sets the respective one or more rotation speeds of the fan to be a second rotation speed which is higher between a rotation speed based on a temperature of the respective one or more hardware components and a rotation speed based on a temperature of the environment.

10. The information processing device according to claim 8, wherein the processor:
determines whether the temperature of the environment is higher than a first temperature and the temperature of the one or more respective hardware components are equal to or lower than respective second temperatures, and
in a case where the temperature of the environment is higher than the first temperature and the temperature of the one or more respective hardware components is equal to or lower than the second temperature, calculates the first difference, calculates the second difference, and acquires the one or more rotation speeds of the fan.

11. The information processing device according to claim 10, wherein the processor:
determines whether power consumption of the respective one or more hardware components is stable, and
in a case where the power consumption of the respective one or more hardware components is stable, determines whether the temperature of the environment is higher than the first temperature and the temperature of the respective one or more hardware components is equal to or lower than the second temperature.

12. The information processing device according to claim 8, wherein the processor:
determines whether the temperature of the environment is higher than a first temperature; and
acquires, as the respective one or more rotation speeds of the fan, the first rotation speed in a case where the temperature of the environment is lower than the first temperature.

13. The information processing device according to claim 8, wherein the processor:
determines whether the temperature of the environment is higher than a first temperature and the temperature of the respective one or more hardware components is equal to or lower than a second temperature, and
in a case where the temperature of the environment is higher than the first temperature and the temperature of the respective one or more hardware components is higher than the second temperature, acquires, as the respective one or more rotation speeds of the fan, a second rotation speed which is higher between a rotation speed based on the temperature of the respective one or more hardware components and a rotation speed based on the temperature of the environment.

14. The information processing device according to claim 8, wherein the one or more hardware components are provided along an air suction line or an air exhaust line of the fan which are included in each of the groups.

15. A non-transitory computer-readable recording medium storing a rotation control program which causes a computer to execute operations of:
    acquiring one or more hardware components included in each of groups obtained by dividing a plurality of hardware components each having a temperature sensor in a system in such a manner that each of the groups includes a fan to cool down the one or more hardware components;
    calculating a first difference between a temperature of each of the one or more hardware components and an upper limit of a tolerable temperature for the respective one or more hardware components;
    calculating a second difference between a temperature of an environment in which the system is installed and an upper limit of a tolerable temperature for the environment, the temperature of the environment being measured by a temperature sensor provided in the system and different from the temperature sensors in the plurality of hardware components;
    comparing the first difference and the second difference to obtain a comparison result indicating a load state of the respective one or more hardware components with respect to the temperature of the environment;
    acquiring one or more rotation speeds for the one or more hardware components of the fan to cool down the one or more hardware components, respectively, based on the comparison result between the first difference and the second difference in such a manner that, in a case where the first difference is greater than the second difference, the respective one or more rotation speeds of the fan are set to be a first rotation speed which is a rotation speed to reduce wasteful power consumption; and
    setting a final rotation speed of the fan to cool down the one or more hardware components based on the one or more rotation speeds.

16. The non-transitory computer-readable recording medium according to claim 15, wherein in the acquiring the one or more rotation speeds of the fan, in a case where the first difference is equal to or less than the second difference, the respective one or more rotation speeds of the fan is set to be a second rotation speed which is higher between a rotation speed based on a temperature of the respective one or more hardware components and a rotation speed based on a temperature of the environment.

17. The non-transitory computer-readable recording medium according to claim 15, comprising:
    determining whether the temperature of the environment is higher than a first temperature and the temperature of the respective one or more hardware components are equal to or lower than respective second temperatures; and
    in a case where the temperature of the environment is higher than the first temperature and the temperature of the respective one or more hardware components is equal to or lower than the second temperature, executing the calculating the first difference, the calculating the second difference, and the acquiring the one or more rotation speeds of the fan.

18. The non-transitory computer-readable recording medium according to claim 15, comprising:
    determining whether or not the temperature of the environment is higher than a first temperature; and
    acquiring, as the respective one or more rotation speeds of the fan, the first rotation speed in a case where the temperature of the environment is lower than the first temperature.

19. The non-transitory computer-readable recording medium according to claim 15, comprising:
    determining whether the temperature of the environment is higher than a first temperature and the temperature of the respective one or more hardware components is equal to or lower than a second temperature; and
    in a case where the temperature of the environment is higher than the first temperature and the temperature of the respective one or more hardware components is higher than the second temperature, acquiring, as the respective one or more rotation speeds of the fan, a second rotation speed which is higher between a rotation speed based on the temperature of the respective one or more hardware components and a rotation speed based on the temperature of the environment.

20. The non-transitory computer-readable recording medium according to claim 15, wherein the one or more hardware components are provided along an air suction line or an air exhaust line of the fan which are included in each of the groups.

* * * * *